(12) United States Patent
Jenkins et al.

(10) Patent No.: US 9,678,141 B2
(45) Date of Patent: *Jun. 13, 2017

(54) MEASUREMENT FOR TRANSISTOR OUTPUT CHARACTERISTICS WITH AND WITHOUT SELF HEATING

(71) Applicant: INTERNATIONAL BUSINESS MACHINES CORPORATION, Armonk, NY (US)

(72) Inventors: Keith A. Jenkins, Sleepy Hollow, NY (US); Barry P. Linder, Hastings-on-Hudson, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 31 days.

This patent is subject to a terminal disclaimer.

(21) Appl. No.: 14/747,546

(22) Filed: Jun. 23, 2015

(65) Prior Publication Data

US 2016/0266196 A1 Sep. 15, 2016

Related U.S. Application Data

(63) Continuation of application No. 14/657,437, filed on Mar. 13, 2015.

(51) Int. Cl.
*G01R 27/08* (2006.01)
*G01R 31/26* (2014.01)
*G01R 31/02* (2006.01)

(52) U.S. Cl.
CPC ....... *G01R 31/2628* (2013.01); *G01R 31/025* (2013.01); *G01R 31/2648* (2013.01)

(58) Field of Classification Search
CPC ............ G01R 31/2628; G01R 31/2621; G01R 31/275; G01R 31/2648; G01R 31/2607;
(Continued)

(56) References Cited

U.S. PATENT DOCUMENTS 5,905,384 A * 5/1999 Inoue ................. G01R 31/2625
257/48
6,396,298 B1 5/2002 Young et al.
(Continued)

FOREIGN PATENT DOCUMENTS

DE 3930006 A1 3/1991

OTHER PUBLICATIONS

List of IBM Patents or Patent Applications Treated as Related.

*Primary Examiner* — Thang Le
(74) *Attorney, Agent, or Firm* — Tutunjian & Bitetto, P.C.; Jennifer R. Davis

(57) ABSTRACT

A method of measuring semiconductor output characteristics is provided that includes connecting a pulse generator to the gate structure of a semiconductor device, and applying a plurality of voltage pulses at least some of which having a different pulse width to the gate structure of the semiconductor device. The average current is measured from the drain structure of the device for a duration of each pulse of the plurality of pulses. From the measured values for the average current, a self-heating curve of the average current divided by the pulse width is plotted as a function of the pulse width. The self-heating curve is then extrapolated to a pulse width substantially equal to zero to provide a value of drain current measurements without self-heating effects.

10 Claims, 10 Drawing Sheets

(58) Field of Classification Search
CPC .......... G01R 31/2608; G01R 31/31924; G01R 31/3004; G01R 31/2884; G01R 31/31922; G01R 31/3008; G01R 31/318511; G01R 31/2831; G01R 35/005; G01R 31/3191; G11C 29/56; H05K 999/99; H01L 22/34; H01L 22/14
USPC ............ 324/762.01–762.03, 762.08, 762.09, 324/750.01, 750.02, 756.05, 73.01, 601; 257/48, 718, 720, E21.077, E21.082, 257/E23.179, E21.521, E21.524

See application file for complete search history.

(56) References Cited

U.S. PATENT DOCUMENTS

| | | | |
|---|---|---|---|
| 7,176,695 B2 | 2/2007 | Bhushan et al. | |
| 7,218,132 B2* | 5/2007 | Krishnan | G01R 31/2621 324/762.09 |
| 7,242,200 B2 | 7/2007 | Okawa | |
| 7,362,122 B2* | 4/2008 | Lin | G01R 31/2625 324/76.23 |
| 8,108,175 B2 | 1/2012 | Chen et al. | |
| 8,183,879 B2* | 5/2012 | Brederlow | H01L 29/78 324/718 |
| 2005/0120315 A1* | 6/2005 | Miura | G06F 17/5036 438/17 |
| 2006/0145708 A1* | 7/2006 | Saito | G01R 31/2601 324/713 |
| 2007/0182439 A1* | 8/2007 | Okawa | G01R 31/2621 324/762.09 |
| 2008/0096292 A1* | 4/2008 | Chatterjee | G01R 31/2621 438/14 |

* cited by examiner

MEASUREMENT FOR TRANSISTOR OUTPUT CHARACTERISTICS WITH AND WITHOUT SELF HEATING

CROSS REFERENCE TO RELATED APPLICATIONS

This application is a Continuation application of co-pending U.S. patent application Ser. No. 14/657,437, filed on Mar. 13, 2015, incorporated herein by reference in its entirety.

BACKGROUND

Technical Field

The present disclosure relates generally to measuring the output characteristics of semiconductor devices. More particularly, the present disclosure relates to measuring the output characteristics of semiconductors without impacting the temperature of the device.

Description of the Related Art

Semiconductor devices typically generate heat as they are operated and dissipate power. For example, under some circumstances, complementary metal oxide semiconductor (CMOS) field effect transistors (FETs) experience heating so that they can be sufficiently hotter than the surrounding environment. This can be referred to as the self-heating effect. Large temperature raises can impact the reliability of the semiconductor device, but can also impact the electrical characteristics of the transistors. Elevated temperatures reduce charge carrier mobility in semiconductor devices, and reduce the threshold voltage of semiconductor devices, such as field effect transistors (FETs), resulting in drain currents, which differ from what would be obtained if they didn't experience self-heating.

SUMMARY

In one embodiment, a method of measuring semiconductor output characteristics is provided. In some embodiments, the method may include measuring semiconductor output characteristics that includes applying a plurality of sets of repetitive pulses of voltage to a gate structure of a semiconductor device with a pulse generator. In some embodiments, a repeated pulse width of at least one of said sets of said plurality of repetitive pulses of voltage is different from the repeated pulse width in a remainder of said plurality of sets of repetitive pulses of voltage that is applied to the gate structure. An average current is measured from the drain region of the semiconductor device for a duration of each of said plurality of said set of repetitive pulses of voltage applied to the gate structure. A self-heating curve of the average current is plotted as a function of the pulse width. The method may further include extrapolating the self-heating curve to a value for the average current when the pulse width is substantially equal to zero. This can provide a value of drain current measurement in the absence of self-heating effects. In some embodiments, the plotting of the self-heating curve includes plotting the self-heating curve of the average current divided by the pulse width that is applied to the gate structure that produced the average current as a function of the pulse width.

In another embodiment, a system of measuring semiconductor output characteristics is provided that includes a pulse generator that is electrically connected to a gate structure of a semiconductor device for applying a plurality of sets of repetitive pulses of voltage to the gate structure of the semiconductor device. In some embodiments, a repeated pulse width of at least one of said plurality of sets of repetitive pulses of voltage is different from the repeated pulse width in a remainder of said plurality of sets of repeated pulses of voltage that is applied to the gate structure. The system may further include a current measuring apparatus in electrical communication with a drain region of a semiconductor device for measuring average current from the drain structure of the device for a duration of each of said plurality of said sets of repeated pulse width of the plurality of pulses. The system may further include a module that is configured to extrapolate a drain current measurement that is free of self-heating from the average current measured from the semiconductor device as a function of the pulse width. The extrapolated drain current is an average current when the pulse width is substantially equal to zero.

In yet another embodiment, the present disclosure provides an electrical structure for measuring semiconductor output characteristics. The electrical structure may include a semiconductor device that is present on a first portion of a substrate, and a pulse generator present on a second portion of the semiconductor device. The semiconductor device may include at least a gate structure, source region, and drain region. The pulse generator is in electrical communication with the gate structure. The pulse generator is configured for applying a plurality of sets of repetitive pulses of voltage to the gate structure of the semiconductor device for determining semiconductor output characteristics without self-heating effects. In some embodiments, a repeated pulse width of at least one of said plurality of sets of repetitive pulses of voltage is different from the repeated pulse width in a remainder of said plurality of sets of repetitive pulses of voltage that is applied to the gate structure.

In yet another aspect, a computer program product is provided that includes a non-transitory computer readable storage medium having computer readable program code embodied therein for performing a method for measuring semiconductor output characteristics. The method performed using the computer program product may include applying a plurality of sets of repetitive pulses of voltage to a gate structure of a semiconductor device with a pulse generator. In some embodiments, a repeated pulse width of at least one of said sets of said plurality of repetitive pulses of voltage is different from the repeated pulse width in a remainder of said plurality of sets of repetitive pulses of voltage that is applied to the gate structure. An average current is measured from the drain region of the semiconductor device for duration of each of said plurality of said set of repetitive pulses of voltage applied to the gate structure. A self-heating curve of the average current is plotted as a function of the pulse width. The method may further include extrapolating the self-heating curve to a value for the average current when the pulse width is substantially equal to zero. This can provide a value of drain current measurement in the absence of self-heating effects.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
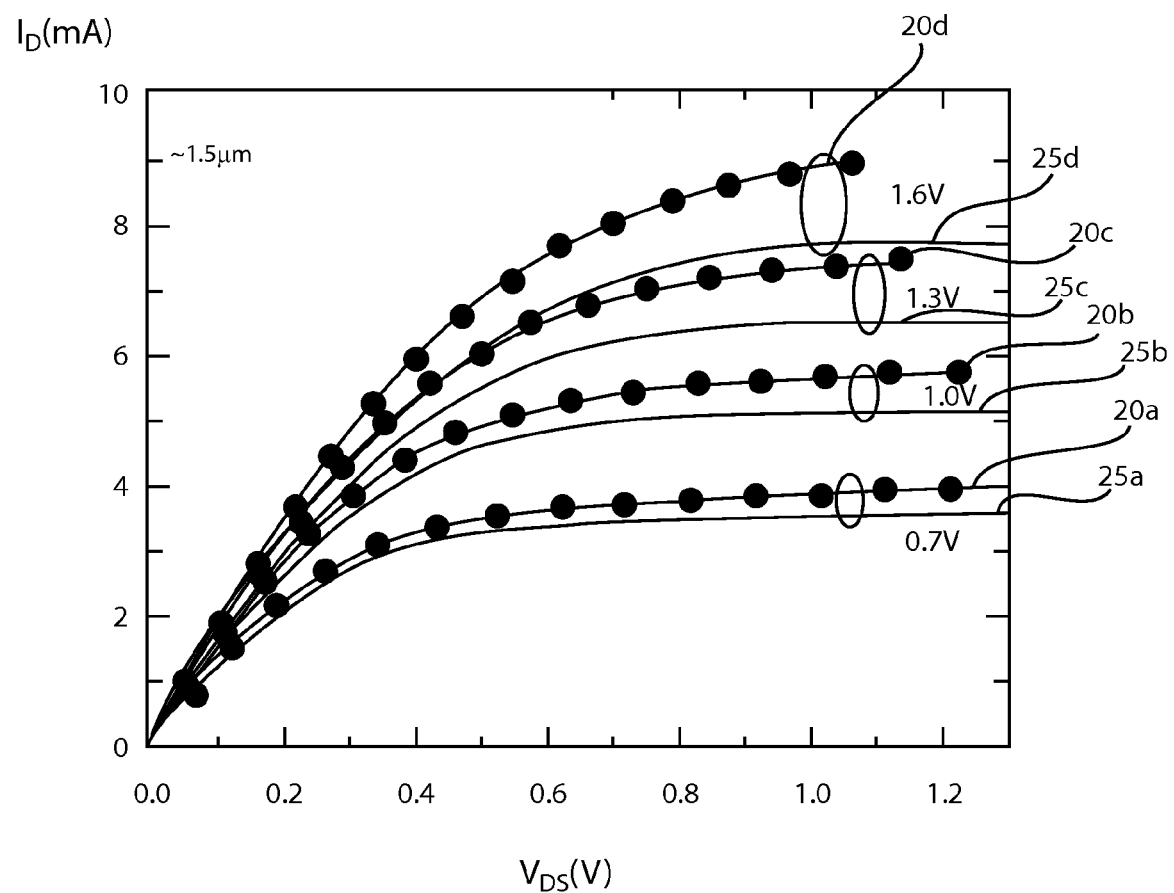
FIG. 1 is a plot illustrating current-voltage (I-V) characteristic curves taken from a semiconductor device formed on an SOI substrate with a pulsed voltage applied to the gate structure of the device in comparison to I-V characteristic curves taken from a comparative semiconductor device formed on an SOI substrate with a constant direct current (DC) applied to the gate structure of the device.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

As will be appreciated by one skilled in the art, aspects of the present disclosure may be embodied as an apparatus (structure), system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

For purposes of the description hereinafter, the terms "upper", "lower", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods, structures, systems, and computer products disclosed herein allow for the measurement of transistor output characteristics with and without self-heating effects. It has been determined that semiconductor devices, such as field effect transistors (FETs), that are built on semiconductor on insulator (SOI) substrates, and vertically oriented field effect transistors, such as fin field effect transistors (FinFETs), are most susceptible to self-heating. Under DC operating conditions, their temperatures may rise from tens to hundreds of degrees (° C.) above ambient. It has further been determined that the large self-heating occurs only when large amounts of current are flowing through the semiconductor device, e.g., FET. In ordinary operation, in digital computers, CMOS FETs are only on a very short time compared to the computer frequency, i.e., the CMOS FETs operate on a low duty cycle. Thus, they typically do not experience much, or any self-heating. Therefore, there is a discrepancy between the measured transistor characteristics obtained from conventional DC measurements, and the actual transient characteristics, which are in effect in a digital computing circuit. The measured DC drain current is generally significantly less than the transient drain current because of self-heating. An example of this difference is shown in the output characteristics of a transistor, as depicted in FIG. 1.

In some embodiments, the "output characteristic" may be an I-V characteristic curve, which is short for Current-Voltage Characteristic Curves or simply I-V curves of an electrical device or component. These are a set of graphical curves which can used to define its operation within an electrical circuit. As its name suggests, I-V characteristic curves show the relationship between the current flowing through an electronic device and the applied voltage across its terminals. In some embodiments, I-V characteristic curves are generally used as a tool to determine and understand the basic parameters of a component or device, and which can also be used to mathematically model its behavior within an electronic circuit.

For example, the "current-voltage characteristics" of a semiconductor device, e.g., transistor, can be shown with various amounts of drive or the I-V characteristic curves of a diode operating in both its forward and reverse regions. Typically, semiconductor devices, such as diodes, transistors and thyristors are constructed using semiconductor PN junctions connected together and as such their I-V characteristics curves will reflect the operation of these PN junctions. Current-Voltage characteristics curves can be used to plot the operation of any electrical or electronic component from resistors, to amplifiers, to semiconductors and solar cells.

Figure 2:
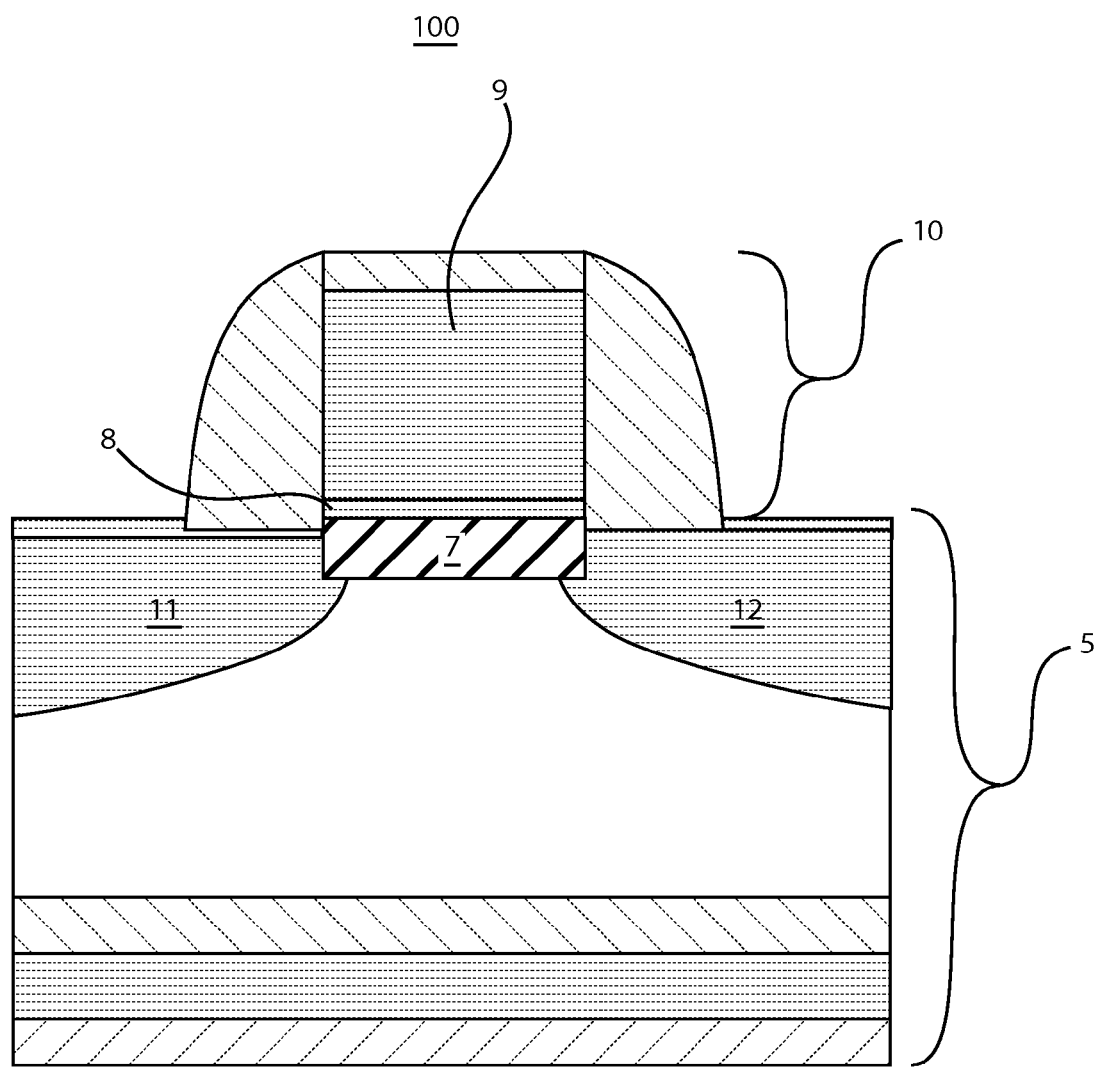
FIG. 2 is a side cross-sectional view of one embodiment of a field effect transistor (FET), as used to provide the I-V characteristic curves depicted in FIG. 1.

FIG. 1 provides a plot illustrating I-V characteristic curves taken from a semiconductor device formed on an SOI substrate with a pulsed voltage applied to the gate structure of the device in comparison to I-V characteristic curves taken from a comparative semiconductor device formed on an SOI substrate with a constant direct current (DC) applied to the gate structure of the device. To create the curves depicted in FIG. 1, a series of point by point measurements were taken, in which the drain voltage corresponding to Vds was changed, and the gate voltage pulse was adjusted to trace out the different curves. The Y-axis of the plot depicted in FIG. 1 is the current measured from the drain of the semiconductor device. The X-axis of the plot depicted in FIG. 1 is the drain to source voltage. The semiconductor device that was employed to provide the I-V characteristic curve depicted in FIG. 1 was a planar field effect transistor (FET) 100 formed on a semiconductor on insulator (SOI) substrate 5, as depicted in FIG. 2. Although the semiconductor devices that provided the electrical characteristics depicted in FIG. 1 were planar semiconductor devices, similar electrical performance is measured in other semiconductor device that are associated with self-heating effects, such as fin-type field effect transistors (FinFETs), which are semiconductor devices that are also applicable to the present disclosure.

As used herein, a "field effect transistor" is a transistor in which output current, i.e., source-drain current, is controlled by the voltage applied to the gate. Referring to FIG. 2, a field effect transistor 100 has three terminals, i.e., gate structure 10, source region 11 and drain region 12. The gate structure 10 is the structure used to control output current (i.e., flow of carriers in the channel) of a semiconducting device 100 through electrical fields. The gate structure 10 typically includes a gate dielectric 8 and a gate conductor 9. The gate dielectric 8 may be composed of silicon oxide, or may be composed of a high-k material, and the gate conductor 9 may be composed of a metal or conductive semiconductor, such as n-type doped polysilicon. The channel region 7 of the FET is the region underlying the gate structure 10 and between the source and drain 11, 12 of a semiconductor device that becomes conductive when the semiconductor device is turned on. As used herein, the term "drain" means a doped region in semiconductor device located at the end of the channel, in which carriers are flowing out of the transistor through the drain. As used herein, the term "source" is a doped region in the semiconductor device, in which majority carriers are flowing into the channel. Although FIG. 2 depicts a planar semiconductor device, the present disclosure is equally applicable to measuring semiconductor output characteristics of other geometries of semiconductor devices that experience self-heating effects, e.g., FinFETs. The structures, systems, methods, and computer program products disclosed herein are equally applicable for measuring the output characteristics of any semiconductor type or geometry that experiences self-heating effects.

The semiconductor device 100 that provided the I-V characteristic curves is formed on a semiconductor on insulator substrate 5. By "semiconductor on insulator" it is meant that at least one dielectric layer is present underlying a semiconductor material layer that provides the site for at least the channel region of the semiconductor device. This upper semiconductor layer is typically referred to as an SOI layer, and typically also contains at least a portion of the source region 11 and the drain region 12.

Referring to FIG. 1, the I-V characteristic curves identified by reference numbers 20a, 20b, 20c, 20d indicate the greater current that is measured from the drain region of a FET, as described above with reference to in FIG. 2, when operating under conditions in which self-heating of the device is eliminated. The plot identified by reference number 20a indicates the I-V characteristics of a FET, as described above with reference to FIG. 2, when the voltage applied to the gate structure of the FET is on the order of 0.7V in the absence of self-heating effects. The plot identified by reference number 20b indicates the I-V characteristics of a FET, as described above with reference to FIG. 2, when the voltage applied to the gate structure of the FET is on the order of 1.0V in the absence of self-heating effects. The plot identified by reference number 20c indicates the I-V characteristics of the FET, as described above with reference to FIG. 2, when the voltage applied to the gate structure of the FET is on the order of 1.3V in the absence of self-heating effects. The plot identified by reference number 20d indicates the I-V characteristics of the FET, as described above with reference to FIG. 2, when the voltage applied to the gate structure of the FET is on the order of 1.6V in the absence of self-heating effects.

The I-V characteristic curves identified by reference numbers 25a, 25b, 25c, 25d indicate that less current is measured from the drain region 12 of a FET, as described above with reference to FIG. 2, when the operating conditions of the FET lead to self-heating. The plot identified by reference number 25a indicates the I-V characteristics of a FET, as described above with reference to FIG. 2, which is experiencing self-heating effects when the voltage applied to the gate structure of the FET is on the order of 0.7V. The plot identified by reference number 25b indicates the I-V characteristics of a FET, as described above with reference to FIG. 2, which is experiencing self-heating effects when the voltage applied to the gate structure of the FET is on the order of 1.0V. The plot identified by reference number 25c indicates the I-V characteristics of the FET, as described above with reference to FIG. 2, which is experiencing self-heating effects when the voltage applied to the gate structure of the FET is on the order of 1.3V. The plot identified by reference number 25d indicates the I-V characteristics of the FET, as described above with reference to FIG. 2, which is experiencing self-heating effects when the voltage applied to the gate structure of the FET is on the order of 1.6V.

Substantial self-heating occurs when large amounts of current are flowing through the FET. In ordinary operation in digital computers, CMOS FETs are only on for a very short time compared to computer frequency, i.e., they operate at a low duty cycle. Thus, they do not experience much, or any, self-heating. Typically, during conventional DC characterization semiconductor devices, such as submicron FETS, and finFETs, heat up in a manner that will impact the IV characteristic curves of the device, as illustrated by plot lines 25a, 25b, 25c, 25d. Submicron FETs, and finFETs, are devices in which the gate and channel regions have dimensions less than 1 micron. Self-heating can occur in these devices when the current applied to the gate structure to effectuate operation of the FET for characterization using conventional DC characterization is constant for a time period of 1 second or more during the measurement. Therefore, substantial current is flowing through the FET during DC characterization, which in turn results in self-heating. As illustrated by comparison of the IV curves taken from FETs experiencing self-heating (I-V characteristic curves having plot lines 25a, 25b, 25c, 25d) to the I-V curves taken from the FETs in which self-heating has been eliminated (I-V characteristic curves having plot lines 20a, 20b, 20c, 20d), the drain current is generally significantly less in the measurements taken from the FETs experiencing self-heating in comparison to the drain current taken from the FETs in which self-heating has been eliminated. This is one example of a type of discrepancy makes it difficult for technology developers to assess their transistors, and difficult for a circuit designer to predict the performance of their circuits.

In some embodiments, the structures, methods, systems and computer products disclosed herein overcome the discrepancy in actual performance of a semiconductor device that is not experiencing self-heating and the measured performance from DC characterization under testing in conditions that facilitate self-heating of semiconductor devices by measuring the performance of semiconductor devices, e.g., drain current, in response to short pulses of voltage applied to the gate structure of the device. The term "pulse" as used herein denotes a plurality of voltage levels each having a nanosecond scale duration over a time period in which voltage is applied to the gate structure of a semiconductor device, in which the voltage level is maintained at a constant value during the time describing the pulse width. The pulse has a square like geometry. The change in voltage levels is repeated for the duration of the pulse. By nanosecond scale, it is meant that the pulse width has a duration of 200 nanoseconds or less. It has been determined, that the self-heating effect experienced by semiconductor devices, such as FETs, during DC characterization has a time constant depending on the construction of the FET and its materials. The time constant indicates how rapidly the device will heat when subjected to a sudden increase of power dissipated in the channel because of an increase drain current. If the current is only "on" for a short time, the channel does not have time to heat, and its temperature will rise only slightly, or not at all.

Figure 3A:
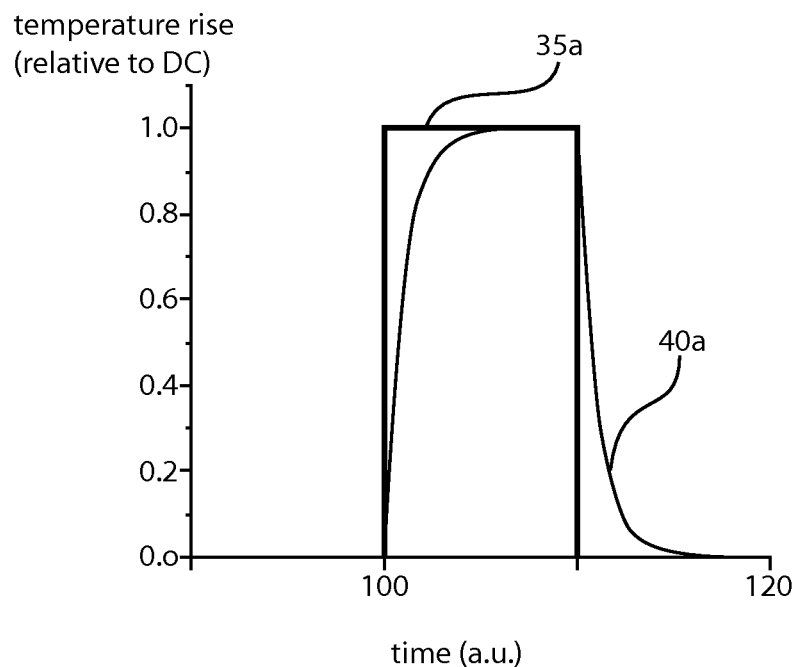
FIG. 3A is a plot depicting the effect of pulse width and thermal time constant on self-heating of a semiconductor device similar to that depicted in FIG. 2, in which the pulse time was equal to ten times the thermal time constant, in accordance with one embodiment of the present disclosure.
Figure 3B:
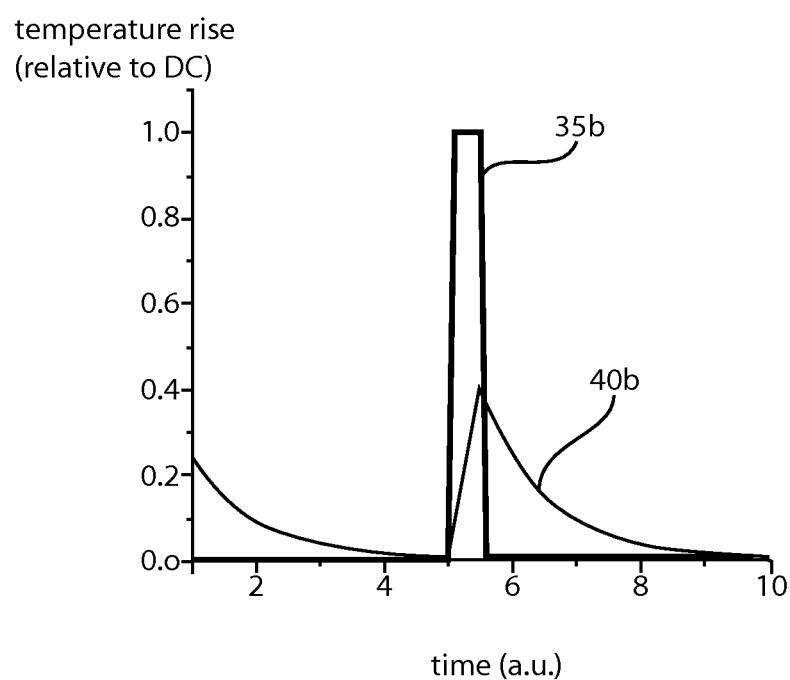
FIG. 3B is a plot depicting the effect of pulse width and thermal time constant on the self-heating of a semiconductor device similar to that depicted in FIG. 2, in which the pulse time was equal to half the thermal time constant, in accordance with one embodiment of the present disclosure.

FIGS. 3A and 3B illustrate the effect of pulse width and thermal time contact on self-heating of the semiconductor device, in which the plot line identified by reference numbers 35a, 35b illustrates the gate voltage pulse and resulting drain current pulse, and the plot line identified by reference numbers 40a, 40b illustrate the resulting temperature increase, i.e., self-heating. The devices used to produce the data depicted in FIGS. 3A and 3B have been described above with reference to FIG. 2. As noted above, other semiconductor geometries, such as finFETs, experience similar self-heating phenomena, and are intended as applicable to the methods disclosed herein. The temperature increases and decreases are governed by equations involving exponentials of time divided by thermal time constant. The Y-axis of the plots for FIGS. 3A and 3B is normalized data illustrating the rise of temperature in the device in comparison to the device prior to the application of the gate and drain pulse, i.e., relative to DC operation. The x-axis for the plots in FIGS. 3A and 3B is time in nanoseconds. The plot lines identified by reference numbers 35a, 40a in FIG. 3A illustrates the temperature rise which will occur when the pulse applied to the gate structure has a time duration which is 10 times the thermal time constant (pulse width=10×thermal time constant). The thermal time constant is the minimum period of time at which self-heating of a semiconductor will occur in response to being switched from an "off" mode of operation to an "on" mode of operation. The plot lines identified by reference numbers 35b, 40b in FIG. 3B illustrate the temperature rise which will occur when the pulse that is applied to the gate structure has a time duration which is half the thermal time constant (pulse width=thermal time constant/2). Comparison of the data depicted in FIG. 3A, in which the pulse width is greater than the thermal time constant, to the data depicted in FIG. 3B, in which the pulse width was less than the thermal time constant, illustrates that a pulse current that is shorter than the thermal time constant will not cause self-heating, and is more indicative of the true drain current in a semiconductor device without self-heating, i.e., non-heated drain current.

It is noted that the self-heating time constant that is described above with reference to FIGS. 3A and 3B is only one example of the self-heating performance of one example of a semiconductor device, and that the present disclosure is not limited to only the above described example. In some other examples, the time constant in which self-heating begins is when the "on" current of the semiconductor device, e.g., FET, is applied for a duration of 100 nanoseconds or less. The term "self-heating" as used herein denotes that the temperature of the semiconductor device increase to 10 degrees ° C. or greater than the ambient atmosphere. The ambient atmosphere is typically around 21° C. to 25° C. at a 1 atm. As noted above, the incidence of self-heating in a semiconductor device is typically impacted by a number of factors, such as the construction of the FET, and the materials used therein. Therefore, self-heating can occur following the application of current applied to gate structure of a semiconductor device for a time period as low as 5 nanoseconds.

In some embodiments, the methods, structures, systems and computer program products that are disclosed herein provide a method for measuring device performance, e.g., drain current, using short voltage pulses applied to at least the gate structure of a semiconductor device. In view of the time periods for the duration of current applied to the gate structure of a semiconductor device that can cause self-heating, the "pulse" time period may be varied. For example, the voltage pulse applied to the gate structure of the semiconductor device may range from 1 nanosecond to 100 nanoseconds. Additional examples of the duration of a "pulse" may include 2, 5, 10, 15, 20, 25, 30, 35, 40, 45, 50, 55, 60, 65, 70, 75, 80, 85, 90 and 95 nanoseconds. Additionally, any range between the aforementioned examples of pulse durations is within the scope of the present disclosure. For example, a pulse may have a duration ranging from about 2 to about 95 nanoseconds; about 10 to about 85 nanoseconds, and about 25 to about 50 nanoseconds, etc.

In some embodiments, to provide the short pulses of current applied to the gate structure of a semiconductor device, the testing apparatus may include at least a pulse generator, a power supply, and an ammeter (which can be combined in a source and measurement unit). One embodiment of the principle of operation of the testing method, apparatus and system disclosed herein is depicted in FIGS. 4 and 5.

Figure 4:
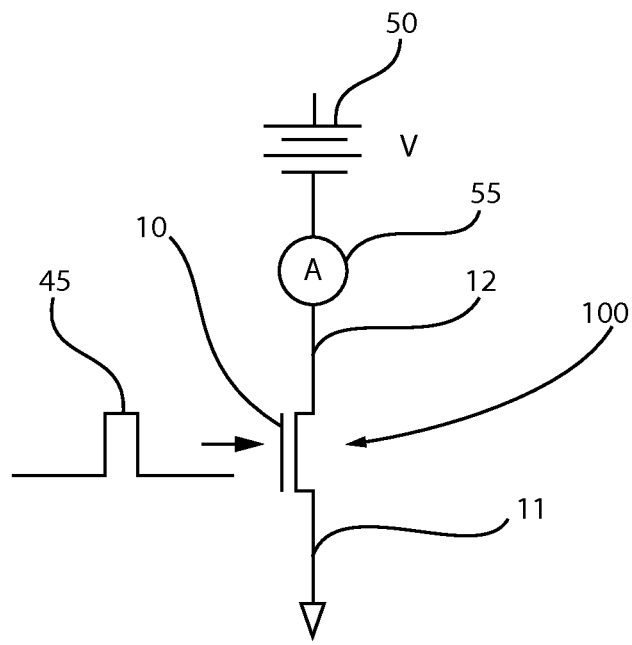
FIG. 4 is a circuit diagram illustrating connectivity of a pulse generator, ammeter, and power source to a semiconductor device for testing, in accordance with one embodiment of the present disclosure.
Figure 5:
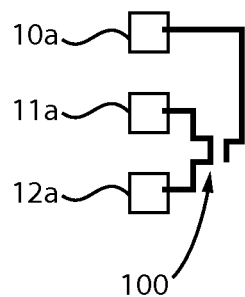
FIG. 5 is a circuit diagram illustrating one embodiment of a wafer probing layout for connecting a pulse generator to a semiconductor device, in accordance with the present disclosure.

FIG. 4 is a circuit diagram illustrating connectivity of a pulse generator 45, ammeter 55, and power source 50 to a semiconductor device 100 for measuring the output characteristics of the semiconductor device 100, such as the I-V characteristic curves of the semiconductor device, i.e., DC testing. The semiconductor device 100 that is depicted in FIG. 4 may be a semiconductor device 100 as described above with reference to FIG. 2. For example, the semiconductor device 100 may be a field effect transistor (FET) including a source region 11, a drain region 12, and a gate structure 10. The term "pulse generator" denotes a piece of electronic test equipment used to generate substantially rectangular voltage pulses. Pulse generators 45 are generally voltage sources. Pulse generators 45 may use digital techniques, analog techniques, or a combination of both techniques to form the output pulses. For example, the pulse repetition rate and duration may be digitally controlled but the pulse amplitude and rise and fall times may be determined by analog circuitry in the output stage of the pulse generator 45.

In some embodiments, the pulse generator 45 may be a digital pattern generator, in which digital electronics stimuli are a specific kind of electrical waveform varying between two conventional voltages correspond to two logic states, i.e., "low state" and "high state", e.g., "0" and "1". One example of a pulse pattern generator that is suitable for the pulse generator 45 that is depicted in FIG. 4 may be a 81134A Pulse Pattern Generator, 3.35 GHz, dual channel pulse generator available from Keysight Technologies Inc. The 81134A Pulse Pattern Generator can provide output level ranging from 50 mV to 2V, and has a fast rise time of 20% to 80% in less than 60 picoseconds. The pulse generator 45 may provide a pulse width, i.e., pulse time, that is less than the thermal time constant of the semiconductor device 100, which can substantial eliminate self-heating effects.

The pulse generator 45 may be connected to provide pulsed voltage to the gate structure 10 of the semiconductor device 100. FIG. 5 is a typical wafer probing layout for use in connecting the pulse generator 45 to the semiconductor device. In some embodiments, the probes of the pulse generator 45, as well as the ammeter 55, contact pads 10a, 11a, 11b, that are in electrical communication to the gate structure 10, source region 11, and drain region 12 of a semiconductor device, respectively. As depicted in FIGS. 4 and 5, the pulse generator 45 may be connected to provide a pulse to the gate structure 10 of the semiconductor device 100, and may be connected to the drain region 12 of the semiconductor device 100 to measure the drain current, i.e., out (drain current). The ground may be source region 11 of the semiconductor device 100, as depicted in FIG. 5. One example of a probe (not shown) that is suitable for contacting at least the gate structure 10, and source region 11 of the semiconductor device 100 for providing electrical communication to the pulse generator is a Dual Infinity Probe, which is part of the Infinity Probe® family available from Cascade Microtech, Inc. It is noted that this is only one example of a probe that is suitable to facilitate electrical communication between the pulse generator 45, and the semiconductor device 100. Other probes are suitable for use with the methods of the present disclosure. For example, a probe that may be employed with the methods disclosed herein typically will have a low contact resistance to reduce resistance to aluminum contact pads, and has the ability to contact pads having a maximum dimension, e.g., width or diameter, of 50 microns.

Figure 6:
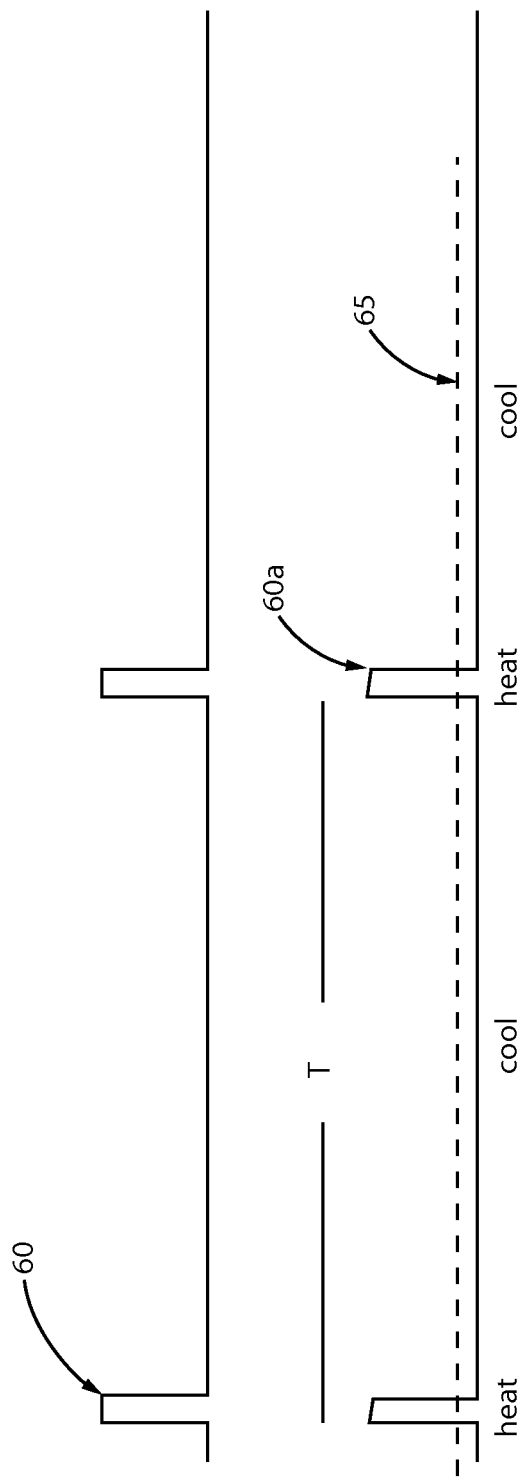
FIG. 6 is a plot of gate voltage pulses and their effect on the average current measured from the drain of a gate structure using the testing apparatus depicted in the circuit diagram illustrated in FIG. 4, in accordance with one embodiment of the present disclosure.

FIG. 6 is a plot of gate and current pulses and their effect on the average current measured from the drain 12 of a gate structure 10 using the testing apparatus depicted in the circuit diagram illustrated in FIG. 4. FIG. 6 depicts how in some embodiment of the present disclosure that the pulses are applied repetitively for a substantial number of pulses of the same width. FIG. 6 illustrates how a pulse 60 is applied to the gate structure 10 of the semiconductor device 100, e.g., FET, being tested, while the drain region 12 of the semiconductor device 100 is biased to a desired voltage and the source region 11 is grounded. In FIG. 6, this pattern repeats for a long enough time that the ammeter 55 can get an average reading, i.e., time average current, as identified by reference number 65. As described herein, the spacing between the pulses must be great enough that the devices can cool off between pulses, which may be referred to as low duty pulsing. The plot identified by reference number 60 is the pulse of voltage applied to the gate structure 10. The gate pulses produce corresponding drain current pulses. The plot identified by reference number 60a is the pulse of current coming from the drain structure, which cannot be measured because of its short duration. The plot identified by reference number 60a note that during the ramp (high point) of the pulses there can be an occurrence of heating within the semiconductor device, that is not present at the time period between pulses. In the absence of self-heating effects, as depicted by plot 60a, the pulsed current from the drain region will be proportional to the pulsed voltage applied to the gate structure. As indicated above, self-heating of the semiconductor device decreases the current measured from the drain region so that the current measured from the drain region is different than the current applied to the gate structure. The ammeter 55, or source, and measurement unit have a low bandwidth, and they typically measure the time average current, and typically do not measure the instantaneous current. Thus, as shown by the dashed line identified by reference number 65, if the pulses are short and spread out, they measure a current much smaller than the instantaneous current. If there is no self-heating, this time-average value would equal the DC current times the duty cycle, regardless of the pulse width. However, because of self-heating, the current is impacted by the pulse width.

Figure 7:
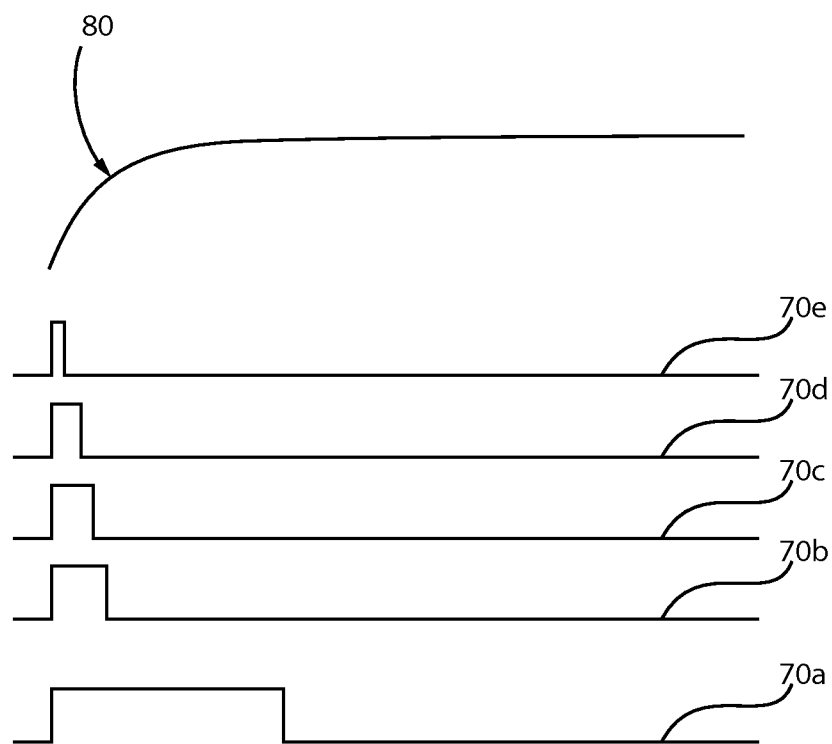
FIG. 7 is a plot correlating the width of voltage pulses applied to the gate structure by a pulse generator to drain current reduction caused by temperature rises in semiconductor devices resulting from self-heating, in accordance with one embodiment of the present disclosure.

The impact of self-heating resulting from pulse width on the measured current from the drain region of the semiconductor device is clearly illustrated in FIG. 7. FIG. 7 depicts five different pulse widths for gate pulses 70a, 70b, 70c, 70d, 70e applied to the gate structure 10 of a semiconductor device 100, as depicted in FIGS. 2, 4 and 5. The plot identified by reference number 70a illustrates a pulse width on the order of 100 nanoseconds. The plot identified by reference number 70b illustrates a pulse width on the order of approximately 25 nanoseconds. The plot identified by reference number 70c illustrates a pulse width on the order of approximately 10 nanoseconds. The plot identified by reference number 70d illustrates a pulse width on the order of approximately 5 nanoseconds. The plot identified by reference number 70e illustrates a pulse width on the order of approximately 2 nanoseconds.

The different pulse widths for the gate pulses are correlated to an overlying plot 80 of temperature rise in a semiconductor device 100, which results from self-heating when the thermal time constant is on the order of 5 nanoseconds. From the beginning of the pulse width to the end of the pulse width there is a corresponding rise in temperature as illustrated by plot 80. The greater the pulse width, the greater the amount of self-heating. As illustrated by comparison of the plot of the pulse having a pulse width of 2 nanoseconds, to the plot of the pulse having the pulse width of 10 nanoseconds, there is a substantial raise from almost no self-heating to a substantially maximum self-heating, i.e., the maximum temperature raise experienced by the semiconductor device during operation.

Figure 8:
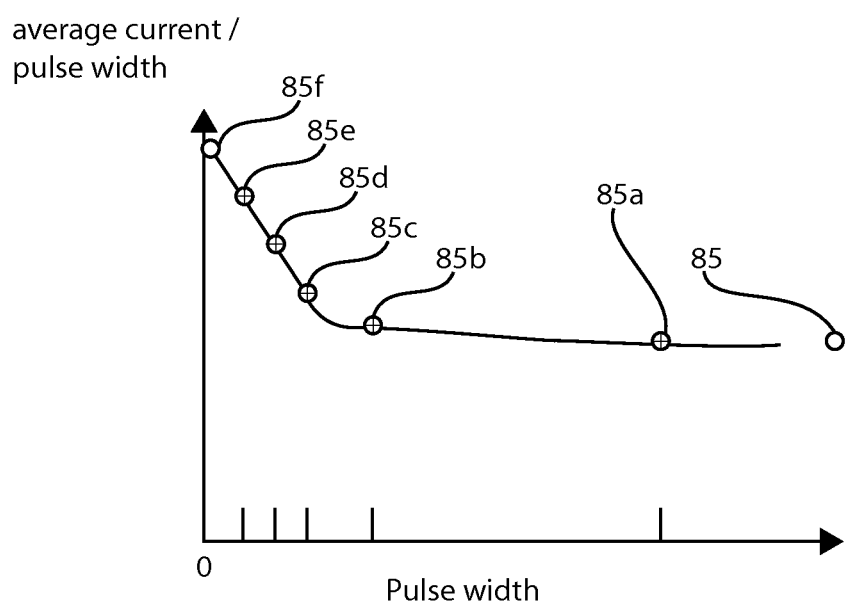
FIG. 8 is a plot of average current divide by pulse width taken from the drain region of a semiconductor device as a function of pulse width, in accordance with one embodiment of the present disclosure.

FIG. 8 is a plot correlating the width of voltage pulses applied to the gate structure 10 by a pulse generator to temperature rises in semiconductor devices resulting from self-heating. The Y-axis of the plot illustrates the average current measured from the drain region of a semiconductor device in response to a voltage pulse applied to the gate structure divided by the pulse width of the voltage pulse employed applied to the gate structure while average current was being measured. The X-axis is the pulse width. The plot illustrated in FIG. 8 is a self-heating curve of the average current as a function of the pulse width, which can be used to extrapolate a value for the average current when the pulse width is substantially equal to zero. This can provide a value for a drain current measurement without self-heating effects.

The data point identified by reference number 85a illustrates the average current measured from the drain region of a semiconductor device 100 (as described above with reference to FIG. 2) in which the pulse applied to the gate structure 10 had the pulse width of the pulse identified by reference number 70*a* in FIG. 7. The data point identified by reference number 85*b* illustrates the average current measured from the drain region of a semiconductor device 100 (as described above with reference to FIG. 2), divided by the pulse width, in which the pulse applied to the gate structure 10 had the pulse width of the pulse identified by reference number 70*b* in FIG. 7. The data point identified by reference number 85*c* illustrates the average current measured from the drain region of a semiconductor device 100 (as described above with reference to FIG. 2), divided by the pulse width, in which the pulse applied to the gate structure 10 had the pulse width of the pulse identified by reference number 70*c* in FIG. 7. The data point identified by reference number 85*d* illustrates the average current measured from the drain region of a semiconductor device 100 (as described above with reference to FIG. 2), divided by the pulse width, in which the pulse applied to the gate structure 10 had the pulse width of the pulse identified by reference number 70*d* in FIG. 7. The data point identified by reference number 85*e* illustrates the average current measured from the drain region of a semiconductor device 100 (as described above with reference to FIG. 2), divided by the pulse width, in which the pulse applied to the gate structure 10 had the pulse width of the pulse identified by reference number 70C in FIG. 7.

As illustrated in FIG. 8, as the temperature increases from self-heating effects that result from the greater pulse widths of the pulse being applied to the gate structure 10 of the semiconductor device, the current, i.e., average current, measured from the drain region of the semiconductor device decreases. The data point identified by reference number 85F is the extrapolated current measured from the drain region of a semiconductor device that a gate pulse is applied to, which does not result in self-heating. This extrapolated data point is to a zero pulse width for the voltage pulse applied to the gate structure. The data point identified by reference number 85 is the extrapolated to identify the current measured from the drain region of a semiconductor device that a gate pulse is applied to, in which full self-heating occurs.

As depicted in FIGS. 7 and 8, the longest pulse widths causes the highest temperature, and the shortest pulse widths result in the lowest temperature that results from self-heating. This influences the average current divided by the pulse width measured by the method described with reference to FIGS. 4-6. If the average current is plotted against the pulse width, then a curve as shown in FIG. 8 results. In FIG. 8, the current increases as the pulses get shorter. An extrapolation to infinitely short pulses indicates the current that would be obtained if there was no self-heating, as illustrated by the data point identified by reference number 85F. For very long pulses, e.g., pulses ranging with pulse widths of hundreds of nanoseconds and more, the semiconductor device, e.g. FET, is full heated. Thus, by measuring at various pulse widths, the currents with and without self-heating can be measured.

In some embodiments of a characterization method of the present disclosure, using the pulse and measurement schemes described above with reference to FIGS. 4-6, pulses of various widths can be used to determine, which pulse widths result in self-heating of the semiconductor device. For example, extrapolation of measurements to a pulse width of zero give a non self-heated current.

Figure 9:
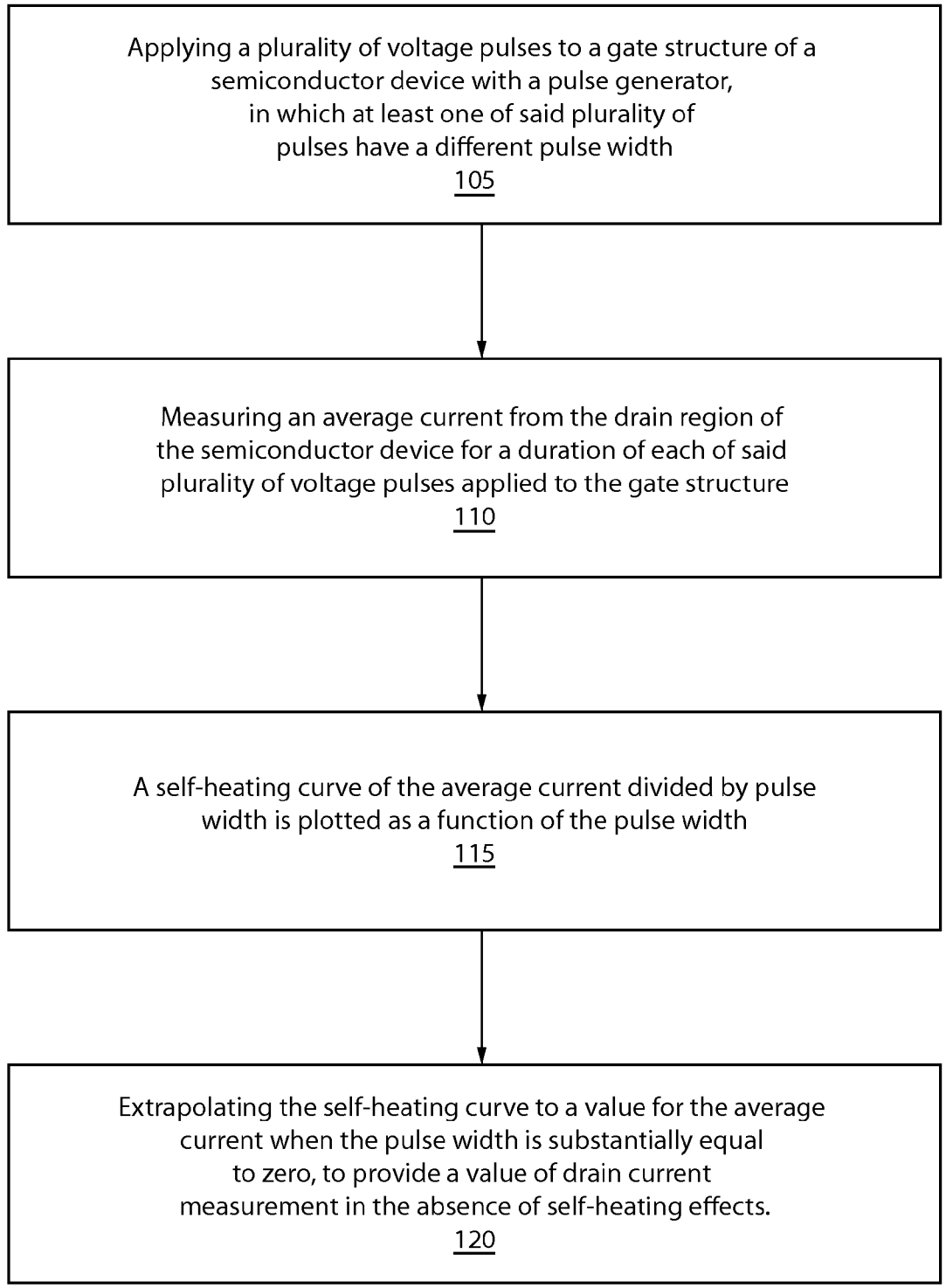
FIG. 9 is a flow chart illustrating one embodiment of a method for measuring semiconductor output characteristics using the above described principles.

FIG. 9 is a flow chart illustrating one embodiment of a method for measuring semiconductor output characteristics using the above described principles. It is noted that the flow chart depicted in FIG. 9 only depicts one embodiment of Applicants' claimed method, and that additional steps than those depicted in FIG. 9 have been contemplated in Applicants' method. For example, the flow chart depicted in FIG. 9 may include one or more of preliminary steps prior to the specific steps depicted in FIG. 9, and one or more concluding steps following the specific steps depicted in FIG. 9. Additionally, one or more intermediary steps may be introduced to the sequence depicted in FIG. 9.

Referring to FIG. 9, in combination with FIGS. 2-8, in some embodiments, the method may begin with applying a plurality of voltage pulses to a gate structure of a semiconductor device with a pulse generator, in which at least one of said plurality of pulses have a different pulse width, at step 105. As illustrated above, the pulse generator 45 may be connected to the gate structure 10 of a semiconductor device 100, as described above with reference to FIGS. 2, 4 and 5. Prior to application of the voltage pulse to the gate structure, an ammeter 55 may be electrically connected to the drain structure of the FET, as described in FIG. 4. The semiconductor device, e.g., FET can be probed using an exemplary probe layout, as depicted in FIG. 5. The FET to be tested is attached to three probe pads 10*a*, 11*a*, 12 *a*, one terminals for the gate structure 10, the source region 11 and the drain region 12, respectively. This can be easily probed with high-frequency probes if a very short pulse must be used for the measurement. Other layouts are possible.

Figure 10:
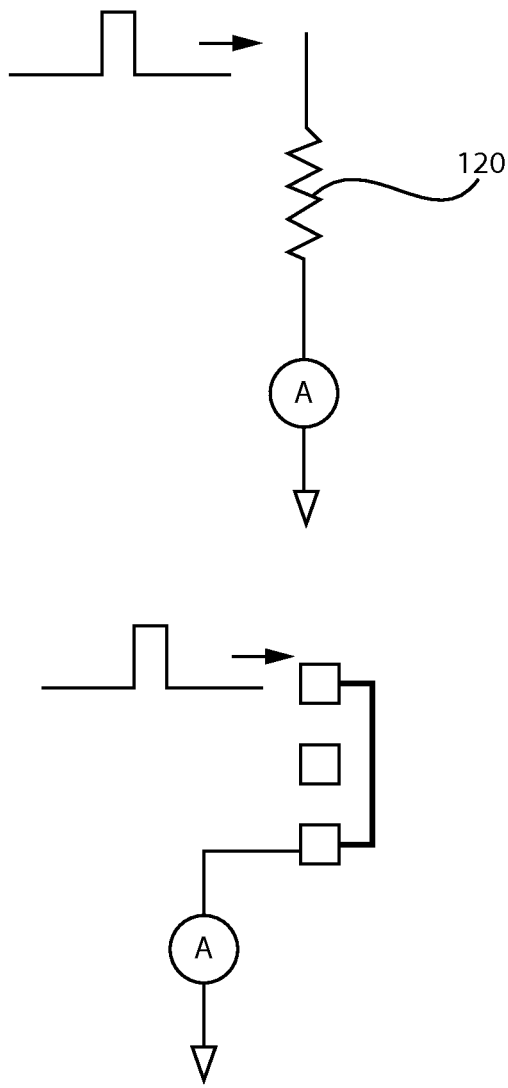
FIG. 10 is a circuit diagram illustrating one embodiment of a pulse width calibration structure, in accordance with the present disclosure.

In some embodiments, for very short pulse measurements, it may be necessary to determine if the pulse generator is correctly producing pulses of the programmed width. In some examples, this can be checked by measuring the average current through a passive structure 120, such as the temperature-insensitive resistor, as shown in FIG. 10. In such a structure, the current should be exactly proportional to the duty cycle of the pulse generator. In some embodiments, calibration may include applying pulses to a short and measuring the average current at each pulse width and period, as depicted in FIG. 10. FIG. 10 also shows how such a calibration structure can be fabricated on a semiconductor wafer next to the FET under test, using the same probe pad configuration as in FIG. 5. The probe pads in FIG. 10 are in the same configuration as the pads in FIG. 5. A pulse is applied to the top pad (which is the gate when there is an FET attached) and a current is measured from the bottom pad (which is the drain when an FET is attached. In the calibration, the pulse applied goes straight into the ammeter, thereby providing a measure of how long the pulse lasted, analogous to the case when an FET is present.

Following connectivity of the pulse generator 45, ammeter 55 and power source 50 to the semiconductor device 100 to be tested as described with reference to FIGS. 4 and 5, a plurality of pulses of current is applied to the gate structure 10 of the semiconductor device with the pulse generator 10, in which at least one of said plurality of pulses have a different pulse width. The pulse of current applied to the gate structure 10 have been described above, for example, with reference to FIGS. 3A, 3B, 6 and 7.

Referring to FIG. 9, an average current is measured from the drain region of the semiconductor device for a duration of each of said plurality of pulses of current to the gate structure, at step 110. The average current is measured with an ammeter. In some embodiments, step 110 is performed contemporaneously with step 105.

In a following step, a self-heating curve of the average current is plotted as a function of the pulse width, as step 115. In some embodiments, the plotting of the self-heating curve includes plotting the self-heating curve of the average current divided by the pulse width that is applied to the gate structure that produced the average current as a function of the pulse width. One example, of plotting the heating curve has been described above with reference to FIG. 8.

Referring to FIG. 9, the method may further include extrapolating the self-heating curve to a value for the average current when the pulse width is substantially equal to zero, at step 120. This can provide a value of drain current measurement in the absence of self-heating effects. The data point identified by reference number 85F is one example of an extrapolated data point when the pulse width is equal to zero to identify the current measured from the drain region of a semiconductor device that a gate pulse is applied to, which does not result in self-heating.

Figure 11:
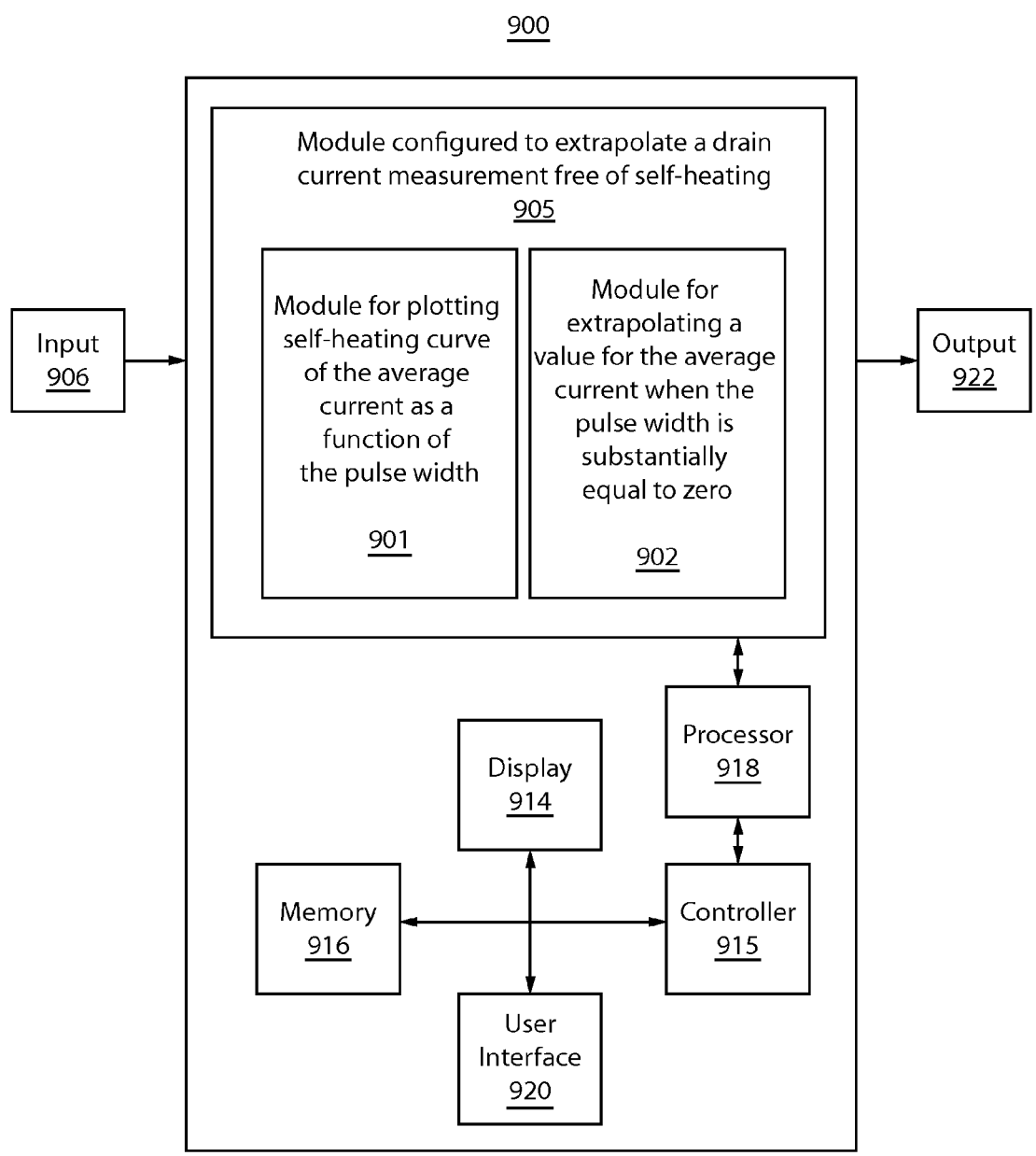
FIG. 11 is a block diagram of a system for measuring semiconductor output characteristics, in accordance with one embodiment of the present disclosure.

FIG. 11 is a block diagram of a system for measuring semiconductor output characteristics. In one embodiment, the system of measuring semiconductor output characteristics is provided that includes a pulse generator 45 that is electrically connected to a gate structure 10 of a semiconductor device 100 for applying a plurality of voltage pulses to the gate structure of the semiconductor device, wherein at least one of the pulses a different pulse width. These features of the system have been described with reference to FIGS. 2-8 and 10, and have been described in steps 105 and 110 of FIG. 9. The system may further include a current measuring apparatus 55 in electrical communication with a drain region 12 of a semiconductor device for measuring average current from the drain region 12 of the device for a duration of each pulse of the plurality of pulses. These features of the system have been described with reference to FIGS. 2-8 and 10, and have been described in steps 105 and 110 of FIG. 9. The pulse data including the pulse width, that is applied to the gate structure, and the average current that is measured from the drain region may be employed as the inputs 906 to the system. The system may further include a module 905 that is configured to extrapolate a drain current measurement that is free of self-heating from the average current measured from the semiconductor device as a function of the pulse width. The extrapolated drain current is an average current when the pulse width is substantially equal to zero.

The module 905 configured to extrapolate a drain current measurement free of self-heating may include a module 901 for plotting self-heating curve of the average current as a function of the pulse width, and a module 902 for extrapolating a value for the average current when the pulse width is substantially equal to zero. One embodiment of the functions of these modules has been described above with reference to FIG. 8, as well as steps 115 and 120 of FIG. 9.

In one embodiment, the system 900 preferably includes one or more processors 918, e.g., hardware processor, and memory 916 for storing applications, modules and other data. In one example, the one or more processors 918 and memory 916 may be components of a computer, in which the memory may be random access memory (RAM), a program memory (preferably a writable read-only memory (ROM) such as a flash ROM) or a combination thereof. The computer may also include an input/output (I/O) controller coupled by a CPU bus. The computer may optionally include a hard drive controller, which is coupled to a hard disk and CPU bus. Hard disk may be used for storing application programs, such as some embodiments of the present disclosure, and data. Alternatively, application programs may be stored in RAM or ROM. I/O controller is coupled by means of an I/O bus to an I/O interface. I/O interface receives and transmits data in analog or digital form over communication links such as a serial link, local area network, wireless link, and parallel link.

The system 900 may include one or more displays 914 for viewing. The displays 914 may permit a user to interact with the system 900 and its components and functions. This may be further facilitated by a user interface 920, which may include a mouse, joystick, or any other peripheral or control to permit user interaction with the system 900 and/or its devices, and may be further facilitated by a controller 915. It should be understood that the components and functions of the system 900 may be integrated into one or more systems or workstations. The display 914, a keyboard and a pointing device (mouse) may also be connected to I/O bus of the computer. Alternatively, separate connections (separate buses) may be used for I/O interface, display, keyboard and pointing device. Programmable processing system may be preprogrammed or it may be programmed (and reprogrammed) by downloading a program from another source (e.g., a floppy disk, CD-ROM, or another computer).

The system 900 may produce output data 912, which in one embodiment may be displayed on one or more display devices 914. In one example, the output data 912 may be an extrapolated value of a drain current measurement from a semiconductor device without self-heating effects.

Figure 12:
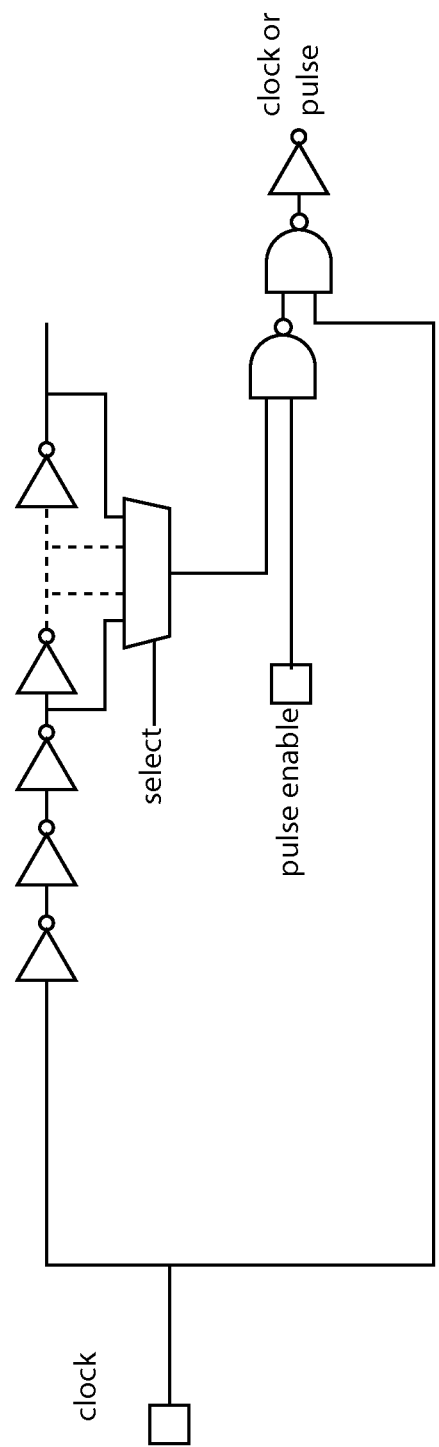
FIG. 12 is a circuit diagram of a pulse generator being integrated into a semiconductor wafer including a semiconductor device, in accordance with one embodiment of the present disclosure.

In yet another embodiment, the present disclosure provides an electrical structure for measuring semiconductor output characteristics. FIG. 12 is a circuit diagram of a pulse generator being integrated into a semiconductor wafer including a semiconductor device. A clock signal is applied to a string of inverters (top) and to a simple conducting wire (bottom). The inverters delay the signal so that when they arrive at the second NAND gate, a pulse is formed with width equal to the difference in the signal paths. The pulse enable signal merely allows or prevents the delayed signal from passing to the second NAND. If disallowed, the signal coming out is just that of the input clock. As inverter delays can be as small as a few picoseconds, pulse widths generated this way can be substantially smaller than 1 nanosecond. The electrical structure may include a semiconductor device that is present on a first portion of a substrate, and a pulse generator present on a second portion of the semiconductor device. The semiconductor device may include at least a gate structure, source region, and drain region. The pulse generator is in electrical communication with the gate structure. The pulse generator is configured for applying a plurality of voltage pulses to the gate structure of the semiconductor device, wherein at least one of the pulses of current have a different pulse width for determining semiconductor output characteristics without self-heating effects.

It should be noted that while the above configuration is illustratively depicted, it is contemplated that other sorts of configurations may also be employed according to the present principles.

Having described preferred embodiments of a method, system, structure and computer product (which are intended to be illustrative and not limiting), it is noted that modifications and variations can be made by persons skilled in the art in light of the above teachings. It is therefore to be understood that changes may be made in the particular embodiments disclosed which are within the scope of the disclosure as outlined by the appended claims. Having thus described aspects of the disclosure, with the details and particularity required by the patent laws, what is claimed and desired protected by Letters Patent is set forth in the appended claims.

What is claimed is:

1. A method of measuring semiconductor output characteristics comprising:

applying a plurality of sets of repetitive pulses of voltage to a gate structure of a semiconductor device with a pulse generator, wherein a repeated pulse width of at least one of said plurality of sets of repetitive pulses of voltage is different from a repeated pulse width in a remainder of said plurality of sets of repetitive pulses of voltage that is applied to the gate structure;

measuring an average current from a drain region of the semiconductor device for a duration of each of said plurality of sets of repetitive pulses of voltage applied to the gate structure;

plotting a self-heating curve of the average current as a function of the pulse width; and extrapolating the self-heating curve to a value for the average current when the pulse width is substantially equal to zero to provide a value of drain current measurement without self-heating effects.

2. The method of claim 1, wherein the plotting of the self-heating curve comprises plotting the self-heating curve of the average current from said measuring of said average current divided by the pulse width applied to said gate structure that produced the average current as said function of the pulse width.

3. The method of claim 1, wherein said applying of said plurality of sets of repetitive pulses of voltage to the gate structure includes applying a voltage over a time period including a plurality of voltages from a low value to a high value, wherein said pulse width is a time duration of the voltage.

4. The method of claim 1, wherein said pulse width ranged from 2 nanoseconds to 100 nanoseconds.

5. The method of claim 1, wherein said measuring of said average current comprises electrically connecting an ammeter to said drain region of the semiconductor device.

6. The method of claim 2, wherein said extrapolating of said self-heating curve to said value for the average current when the pulse width is substantially equal to zero to provide said value of drain current measurement without self-heating effects comprises following extending the curve trend to the zero value.

7. The method of claim 1, wherein the pulse generator is separate from a semiconductor substrate that contains the semiconductor device.

8. The method of claim 1, wherein the pulse generator is present on a semiconductor substrate that contains the semiconductor device.

9. The method of claim 1, wherein the semiconductor device is a field effect transistor having submicron scale.

10. The method of claim 1, further comprising a non-transitory computer readable medium comprising a computer readable program for said measuring semiconductor output characteristics, wherein the computer readable program is executed on a computer.

* * * * *